(12) United States Patent
Gajda et al.

(10) Patent No.: US 11,921,160 B2
(45) Date of Patent: Mar. 5, 2024

(54) USING SCAN CHAINS TO READ OUT DATA FROM INTEGRATED SENSORS DURING SCAN TESTS

(71) Applicant: Synopsys, Inc., Mountain View, CA (US)

(72) Inventors: Bartosz Grzegorz Gajda, Juszkowo (PL); Anubhav Sinha, Hyderabad (IN)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/834,433

(22) Filed: Jun. 7, 2022

(65) Prior Publication Data

US 2023/0393199 A1    Dec. 7, 2023

(51) Int. Cl.
*G01R 31/3185*    (2006.01)

(52) U.S. Cl.
CPC .......... *G01R 31/318536* (2013.01); *G01R 31/318547* (2013.01); *G01R 31/318552* (2013.01); *G01R 31/318566* (2013.01); *G01R 31/318569* (2013.01); *G01R 31/31858* (2013.01)

(58) Field of Classification Search
CPC .... G01R 31/318536; G01R 31/318552; G01R 31/318547; G01R 31/318566; G01R 31/318569; G01R 31/31858
USPC ........ 714/729, 726, 731, 735, 740, 742, 745
See application file for complete search history.

(56) References Cited

U.S. PATENT DOCUMENTS

| | | | | |
|---|---|---|---|---|
| 4,577,149 A | * | 3/1986 | Zbinden | G01R 31/52 324/537 |
| 8,310,265 B2 | * | 11/2012 | Zjajo | G01R 31/318558 324/762.01 |
| 10,746,795 B2 | * | 8/2020 | Sofer | G01R 31/318594 |
| 2003/0182025 A1 | * | 9/2003 | Tseng | B60W 40/112 701/1 |
| 2010/0198556 A1 | * | 8/2010 | Kost | G05B 23/0221 702/183 |
| 2015/0276869 A1 | * | 10/2015 | Sofer | G01R 31/3177 714/727 |
| 2017/0010320 A1 | * | 1/2017 | Pal | G01R 31/2834 |

(Continued)

OTHER PUBLICATIONS

Sadi et al., Design of a Network of Digital Sensor Macros for Extracting Power Supply Noise Profile in SoCs, May 2016, IEEE, pp. 1702-1714 (Year: 2016).*

(Continued)

*Primary Examiner* — John J Tabone, Jr.
(74) *Attorney, Agent, or Firm* — Fenwick & West LLP

(57) ABSTRACT

Sensor data relating to operating conditions for an integrated circuit are read out through scan chains. Scan tests are run on an integrated circuit containing logic circuits that implement logic functions. The logic circuits are interconnected to form scan chains which are used in running the scan tests. The scan test data resulting from the scan tests is read out from the logic circuits through these scan chains. During the scan tests, sensor blocks capture measurements of the operating conditions for the logic circuits. The operating conditions may include process, voltage and/or temperature conditions, for example. The sensor blocks are also interconnected to form one or more scan chains, and sensor data produced from the captured measurements is read out through these scan chains concurrently with the read out of the scan test data.

18 Claims, 10 Drawing Sheets

(56) References Cited

U.S. PATENT DOCUMENTS

2020/0094412 A1\* 3/2020 Casse .................. G01L 5/226
2021/0123972 A1   4/2021 Suzuki et al.
2021/0294398 A1\* 9/2021 Jain ................... G06F 1/3203

OTHER PUBLICATIONS

He et al., SAM: A Comprehensive Mechanism for Accessing Embedded Sensors in Modern SoCs, 2014, IEEE, pp. 240-245. (Year: 2014).\*
Wooters et al., Tracking On-Chip Age Using Distributed, Embedded Sensors, Nov. 2012, IEEE, pp. 1974-1985. (Year: 2012).\*
Xue et al., Built-in Current Sensor for IDDQ Test, 2004, IEEE, pp. 3-10. (Year: 2004).\*
PCT International Search Report and Written Opinion, PCT Application No. PCT/US2023/016333, dated Aug. 4, 2023, 13 pages.

\* cited by examiner

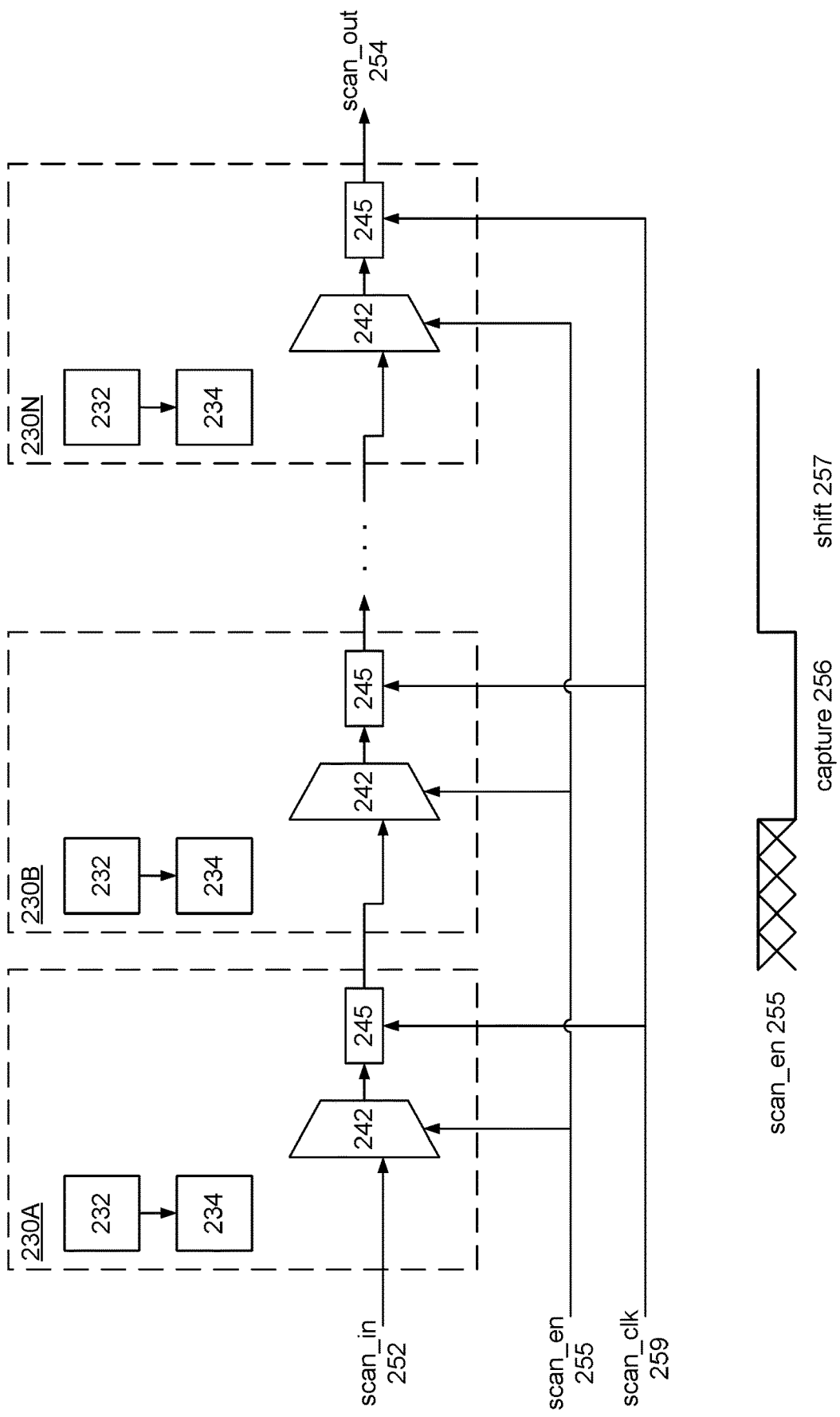

USING SCAN CHAINS TO READ OUT DATA FROM INTEGRATED SENSORS DURING SCAN TESTS

TECHNICAL FIELD

The present disclosure generally relates to testing of electronic circuits. In particular, the present disclosure relates to the read out of data from integrated sensors during testing of integrated circuits.

BACKGROUND

As technology nodes shrink and the complexity and gate count of devices increase, the testing of manufactured integrated circuits becomes increasingly important and increasingly complex. However, testing can be limited if only the logic circuits that are directly connected to the input/output (I/O) pins of the integrated circuit are accessible during testing. With limited access to the interior of the chip, it can be difficult to set internal signals to test various scenarios and to read internal signals to determine whether circuits are faulty.

One approach to improve this situation is through the use of scan chains. Scan chains are chains of internal circuits that can be accessed through a chip's I/O pins. In this way, the logic state of internal circuits can be set to certain values by transmitting those values to the internal circuits through the scan chain. This can be used to set variable states for testing. Once the tests are run, the resulting values at internal circuits may be observed by capturing the values at the internal circuits and then reading out the values through the scan chain. These tests may be referred to as scan tests.

SUMMARY

In one aspect, sensor data is also read out through scan chains. Scan tests are run on an integrated circuit containing logic circuits that implement logic functions. The logic circuits are interconnected to form scan chains which are used in running the scan tests. The scan test data resulting from the scan tests is read out from the logic circuits through these scan chains. During the scan tests, sensor blocks capture measurements of the operating conditions for the logic circuits. The operating conditions may include process, voltage and/or temperature conditions, for example. The sensor blocks are also interconnected to form one or more scan chains, and sensor data produced from the captured measurements is read out through these scan chains concurrently with the read out of the scan test data.

In another aspect, the sensor data for the scan tests may be correlated with the scan test data and used to improve the testing of the integrated circuits.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 2B and 2C are diagrams showing operation of the sensor blocks and scan chain of FIG. 2A.

DETAILED DESCRIPTION

Figure 1:
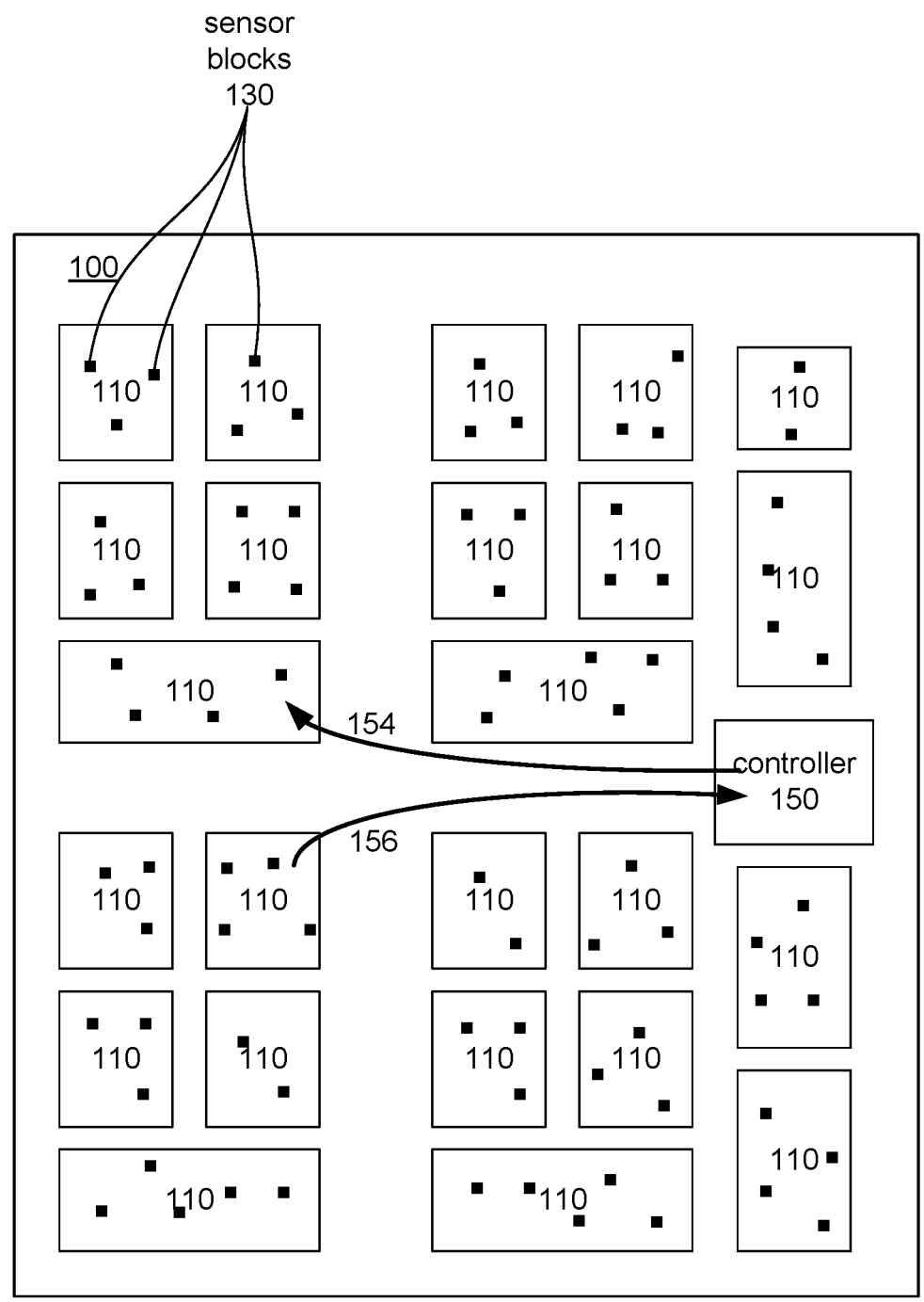
FIG. 1 is a block diagram of an integrated circuit with built-in sensor blocks, in accordance with some embodiments of the present disclosure.

Aspects of the present disclosure relate to using scan chains to shift out data from integrated sensors during scan test of integrated circuits. Scan chains are often used to test the logic functions implemented on integrated circuits. During these tests (referred to as scan tests), the logic circuits that implement the logic functions are interconnected to form a scan chain. The scan chain provides access to sequential circuits in the interior of the device under test (DUT). In this way, interior circuits can be tested. Test stimuli can be input to the interior circuits as needed to run a particular test, and the resulting outputs can be observed and compared to the expected outcomes.

However, scan tests may result in operating conditions that deviate from normal operating conditions. For example, the scan tests may exercise a set of circuits more actively than would occur during normal operation. The increased activity may cause higher temperatures than normal or lower voltages due to higher power consumption than normal. These out-of-range operating conditions may cause scan test failures which would not occur under normal operating conditions. Conversely, circuits may pass scan tests but may cause abnormal operating conditions which pose a greater risk of failure once deployed in the field. As a result, it is beneficial to monitor the operating conditions across the DUT during scan tests.

Devices may have integrated sensors built into the device to monitor the operating conditions during normal operation of the device. However, those sensors typically are accessible by automated testers only via dedicated interfaces, if at all. As a result, the operating conditions may be sampled only before and after scan tests, or scan tests may be interrupted to allow sampling of the operating conditions, but it is difficult to continuously sample operating conditions throughout the duration of a scan test. Continuous sampling during scan tests could be achieved by temporarily storing the operating conditions in on-chip memory during the scan test, but this can require large amounts of dedicated on-chip memory.

In one aspect of the present disclosure, the operating conditions during scan tests are monitored by using scan chains to read out the operating conditions along with the scan test data. Sensor blocks integrated on the DUT capture measurements of the operating conditions during the scan tests. The sensor blocks are interconnected to form one or more scan chains, which will be referred to as sensor scan chains to distinguish them from the scan chains for the logic circuits under test (referred to as logic scan chains). The resulting sensor data, which may undergo some local processing, is read out through the sensor scan chains concurrently with read out of the scan test data through the logic scan chains.

Technical advantages of the present disclosure may include the following. The operating conditions are measured during the scan test, rather than before or after the scan test. These measurements more accurately reflect the operating conditions during the scan test. Furthermore, the operating conditions may be measured without interrupting the scan test.

Operating conditions that are out-of-range may be identified and desired actions taken. For example, if the scan test itself causes out-of-range conditions that normally would not occur and these conditions are the cause of scan test failures, then the scan test may be modified to reduce or eliminate these false failures. Alternatively, if operating conditions for a specific DUT fall outside the operating conditions experienced by other DUTs running the same scan tests, then this may indicate that this DUT is an outlier at greater risk of future failure even if it currently passes the scan tests. The correlation between operating conditions and the scan test data may also be used to improve the design of the DUT or assist in root cause analysis of future failures. For example, the operating conditions may be displayed to a user alongside the corresponding scan test data, thus facilitating the testing.

In more detail, FIG. 1 is a block diagram of an integrated circuit with built-in sensor blocks, in accordance with some embodiments of the present disclosure. In this particular example, the integrated circuit 100 contains different functional blocks 110. Examples could include processor cores, on-chip memory, input/output (I/O) interfaces, other types of logic, and analog and mixed signal circuits.

The integrated circuit 100 also includes sensor blocks, shown as small black squares some of which are labelled 130, and a corresponding controller 150. The sensor blocks 130 are distributed throughout the integrated circuit in order to monitor operating conditions at different points across the integrated circuit. Examples of operating conditions include process, voltage and temperature (PVT) conditions. Process conditions (such as reflected in the speed of transistors) may be monitored by circuits, such as a ring oscillator with frequency that varies as a function of process variations or path delay monitors that measure the timing delay across paths in the circuit. Voltage conditions may be monitored by circuits that measure voltage. The voltage measured may include the supply voltage. The voltage conditions can include both slow measurements (e.g., DC level of supply voltage) or fast measurements (e.g., measurements of transients in the supply voltage). Temperature conditions may be monitored by temperature transducers, such as bipolar transistors. The distribution of sensor blocks 130 shown in FIG. 1 is not intended to be limiting. Different distributions of sensor blocks 130 will be apparent.

In some embodiments, a sensor controller 150 is also integrated on-chip. In FIG. 1, it is shown as one block but it may be implemented in a distributed fashion. The sensor controller 150 communicates with the sensor blocks 130. The controller 150 may send control signals 154 to configure the sensor blocks 130. The controller 150 may also receive data 156 from the sensor blocks 130. This can include data about the sensor block's current state of operation. It may also include sensor data, which are the output produced by the sensor blocks based on their measurement of operating conditions. In some cases, the controller 150 may provide some analysis of the received data 156.

During testing, the sensor blocks 130 may communicate with the tester via the controller 150. However, they may also communicate with the tester via more direct paths that bypass the controller. In such cases, the on-chip controller 150 is not required and some chips may not have an on-chip controller.

Figure 2A:
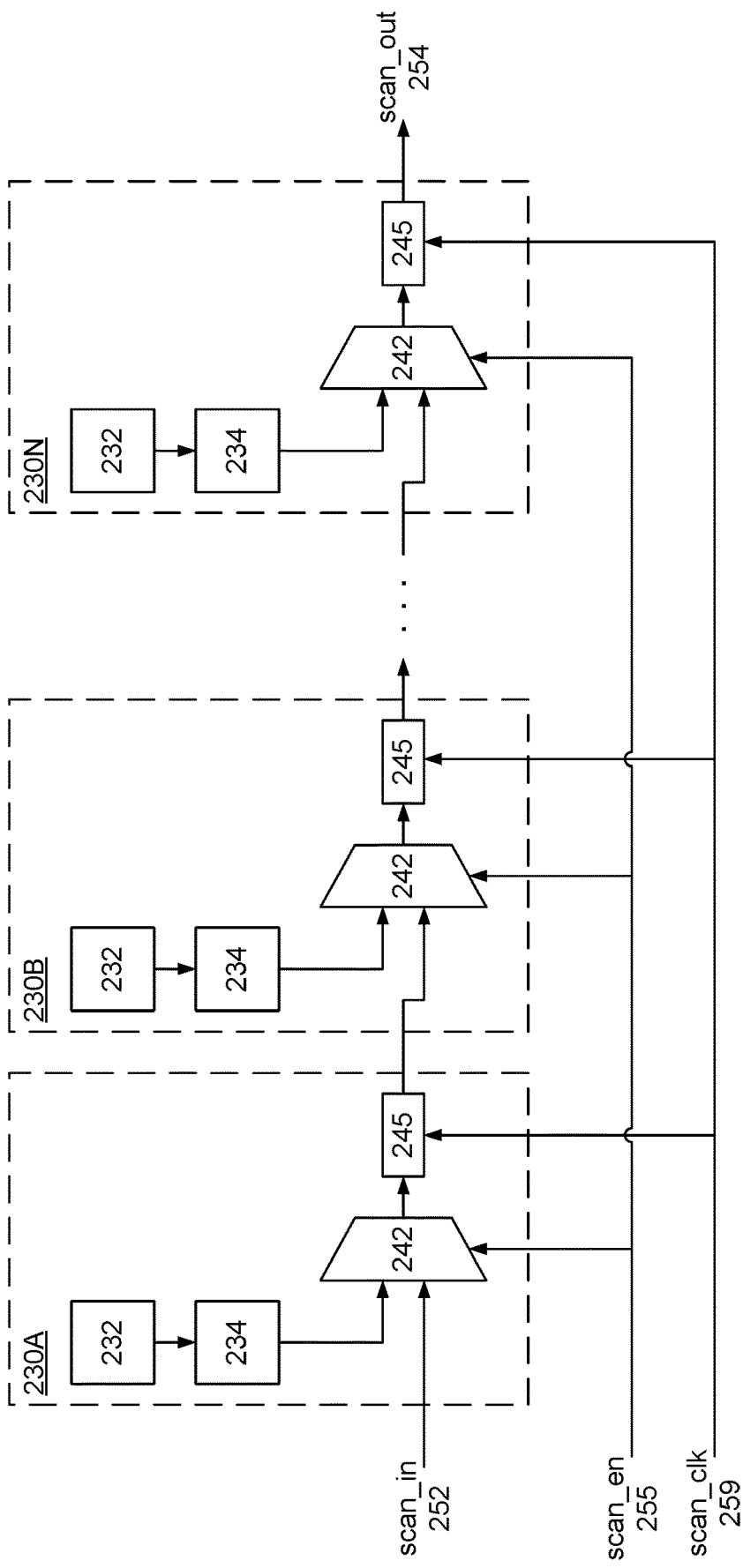
FIG. 2A is a block diagram of sensor blocks interconnected to form a scan chain, in accordance with some embodiments of the present disclosure.

In one aspect, scan chains are used to read out sensor data from the sensor blocks, along with the scan test data for the logical functions of the chip. FIG. 2A is a block diagram of sensor blocks 230A-N interconnected to form a scan chain, in accordance with some embodiments of the present disclosure. Consider first sensor block 230B. Sensor block 230B includes a sensor 232, optionally some on-chip processing 234, a scan multiplexer (mux) 242 and a streaming register 245 or another type of data storage. The sensor 232 measures the operating condition and the measured sensor data is processed by circuitry 234 to produce the sensor data. The sensor data may be samples of the operating condition. It may be processed versions of the samples, such as a rolling average of samples or a filtered version of the samples. The sensor data may also be based on aggregate characteristics of a set of samples, such as the minimum, maximum, average, standard deviation or other statistical values calculated over a set of samples. The number of samples of sensor data after processing 234 may be less than the original number of samples of the operating condition measured by the sensor 232. This reduces the bandwidth required to read out the sensor data.

The sensor block 230B also includes a scan multiplexer 242 and a streaming register 245. One input of the mux 242 is the output of the sensor pipeline 232-234. The other input is the output of the streaming register 245 from an upstream sensor block 230A. The mux 242 is controlled by scan enable signal (scan_en) 255. The streaming register 245 is clocked by scan clock (scan_clk) 259. The other sensor blocks 230 may have a similar structure, with some exceptions. For example, the mux 242 in the first sensor block 230A in the chain may receive a scan in signal (scan_in) 252 rather than the output of an upstream sensor block. Similarly, the output of the streaming register 245 of the last sensor block 230N in the chain may be a scan out signal (scan_out) 254 rather than the input to a downstream sensor block.

Figure 2B:
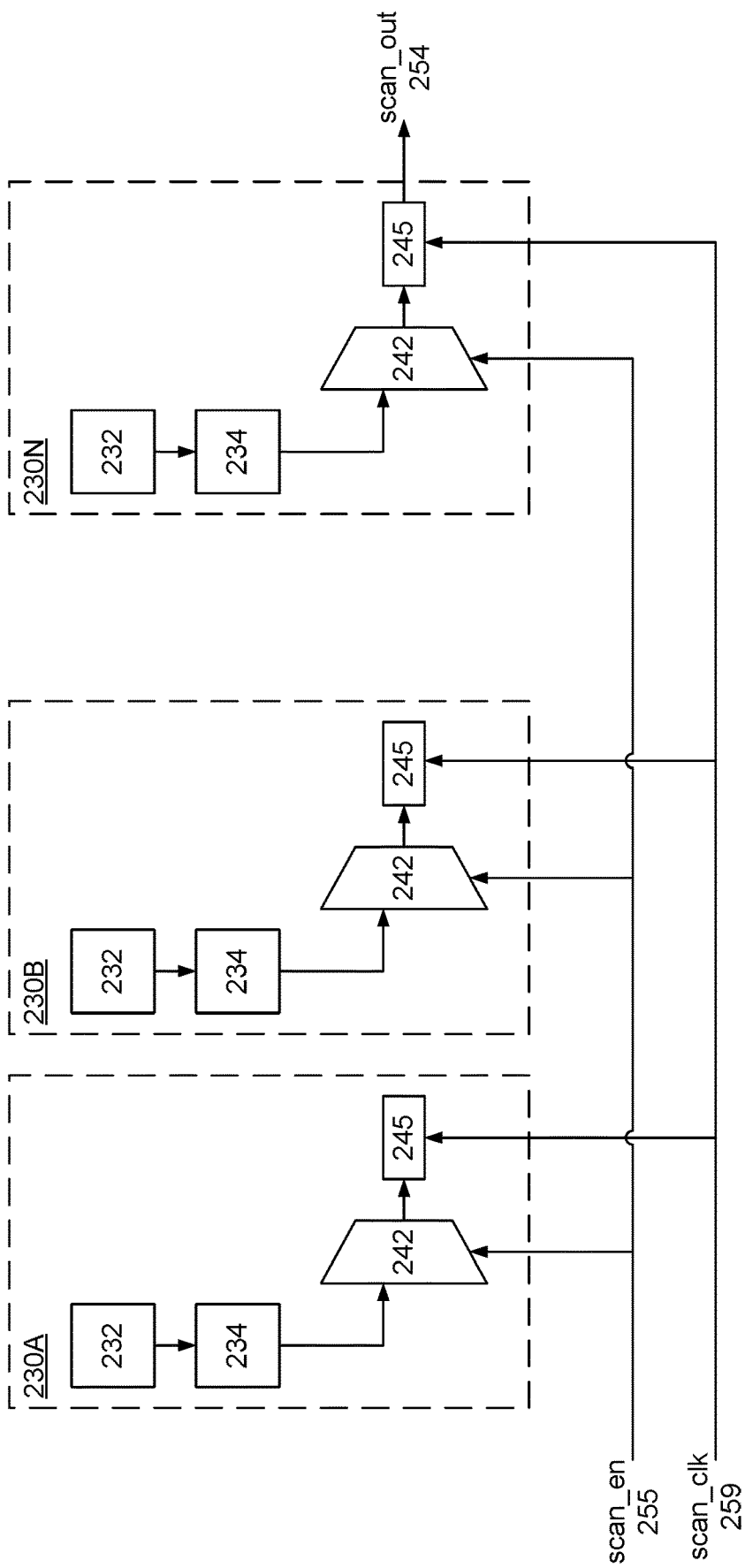

FIGS. 2B and 2C are diagrams showing operation of the sensor blocks and scan chain of FIG. 2A. In FIG. 2B, scan is disabled during a capture period 256, as shown by the scan_en 255 signal at the bottom of the figure going low during the capture period 256. During the capture period 256, the muxes 242 select the mux input connected to the sensor pipeline 232-234 and thus operate to connect each sensor pipeline 232-234 to the input of the corresponding streaming register 245, as shown in FIG. 2B. The mux 242 input connected to the streaming register 245 from the prior sensor block is not used and, for clarity, these disabled connections are not shown in FIG. 2B. The sensor data from the sensor pipeline 232-234 is captured in the streaming registers 245, according to the scan clock 259.

In FIG. 2C, scan shift is enabled, as shown by the scan_en 255 signal going high. This period may be referred to as a shift period or scan shift period 257. During the scan shift period 257, the muxes 242 select the mux input connected to the streaming register 245 from the prior sensor block.

This operates to connect the streaming registers 245 to form a scan chain, as shown in FIG. 2C. The streaming registers 245 contain the sensor data that was loaded during the capture period 256 and, during the shift period 257, this data is shifted out and off of the chip via the scan chain and scan out pin 254. Note that in this configuration, the scan in pin 252 is not needed. The mux 242 input to the sensor pipeline 232-234 is not used and is not shown in FIG. 2C for clarity.

Figure 3A:
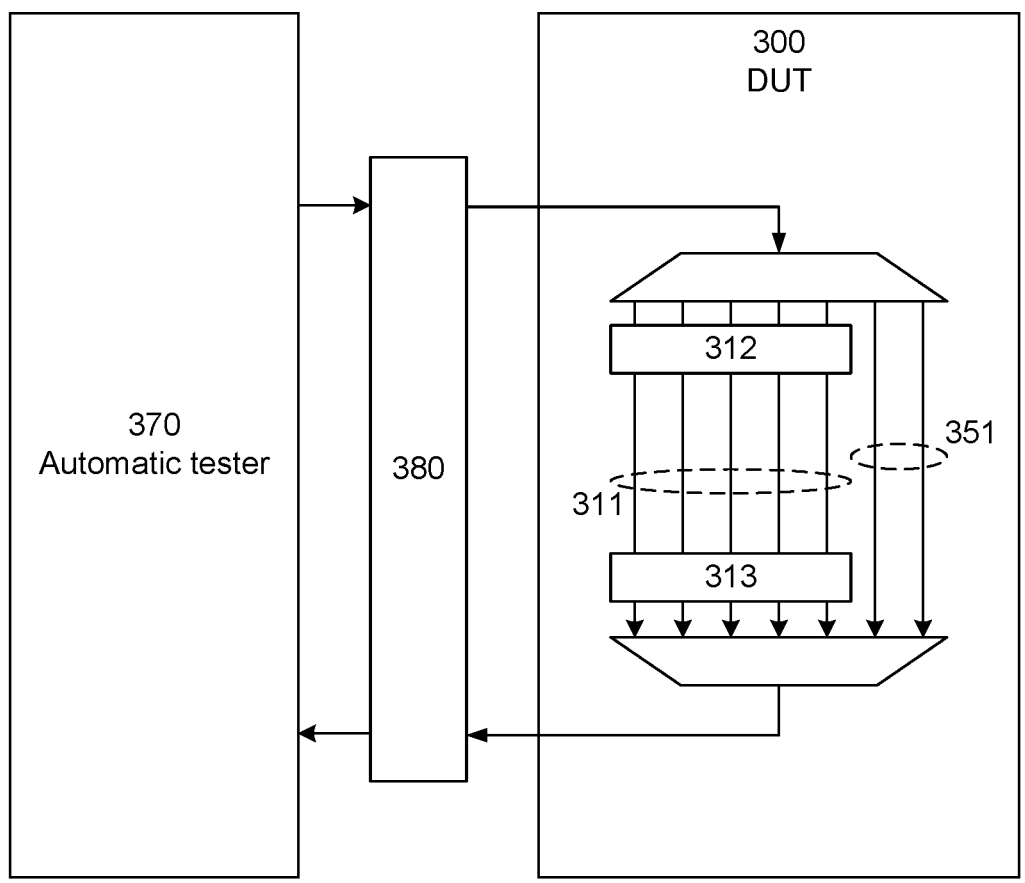
FIG. 3A is a block diagram of a testing system using sensor scan chains, in accordance with some embodiments of the present disclosure.
Figure 3B:
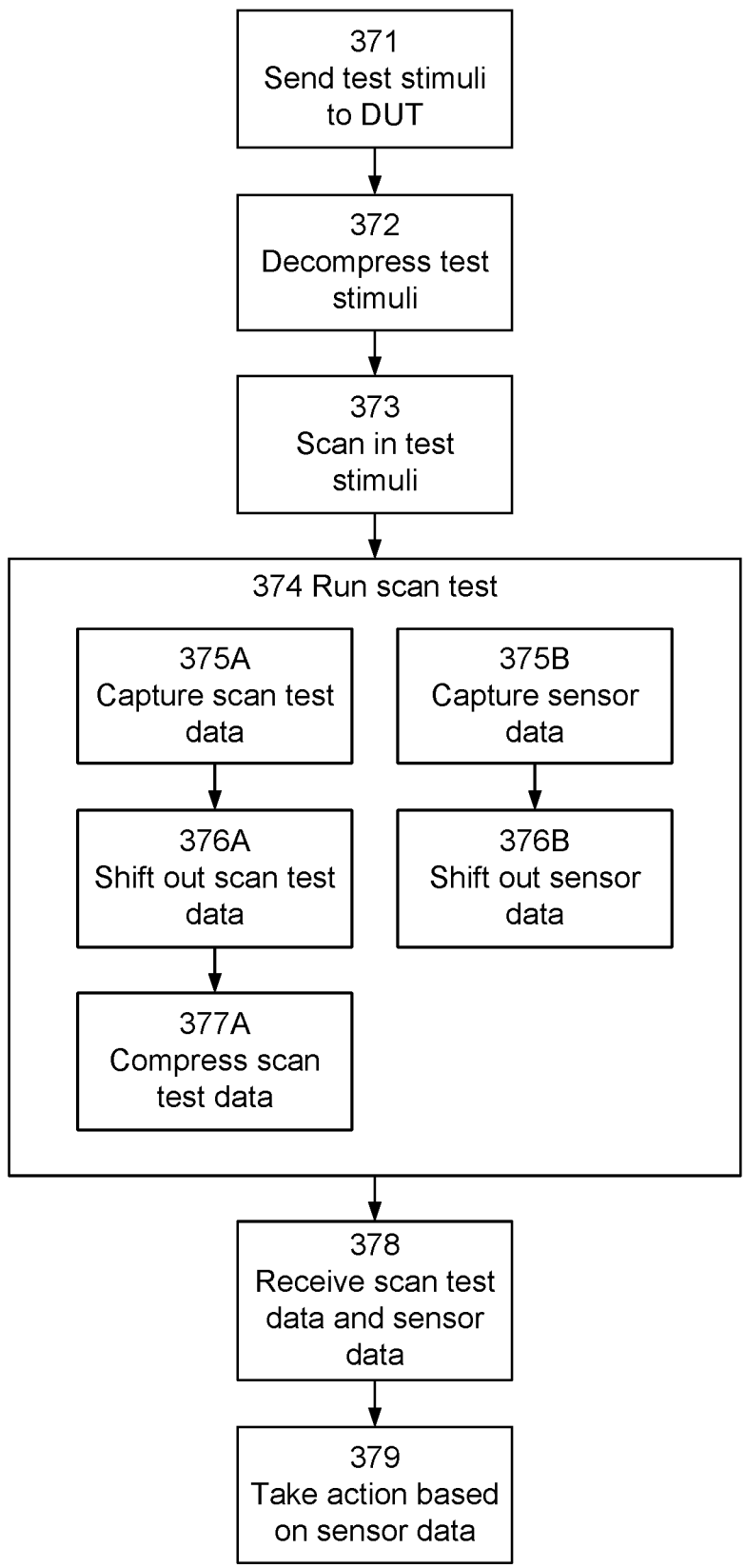
FIG. 3B is a flow diagram of operation of the testing system of FIG. 3A.

FIG. 3A is a block diagram of a testing system using sensor scan chains, in accordance with some embodiments of the present disclosure. FIG. 3B is a flow diagram of operation of the testing system of FIG. 3A. The testing system includes a device under test (DUT) 300, an automatic tester 370, and a test interface 380 between the two. The automatic tester 370 runs scan tests on the DUT 300. These scan tests make use of logic scan chains 311 and sensor scan chains 351. Data transmitted between the tester 370 and the DUT 300 may be compressed, so the DUT may include a data decompressor 312 and a data compressor 313, especially for use with the logic scan chains 311.

Referring to FIG. 3B, the tester 370 runs scan tests as follows. At 371, the tester 370 sends test stimuli to the DUT. This data is used to set internal circuits to the initial states for the desired test. The test setup data is sent in compressed form to the DUT. At 372, the data decompressor 312 within the DUT decompresses the setup data and, at 373, it shifts the data into the relevant interior logic circuits via the logic scan chains 311. In this example, data is not shifted into the sensor blocks so the sensor scan chains 351 need not be connected to the scan input. In an alternative, scan in can be used to shift configuration data to the sensor blocks.

At 374, the DUT then operates, moving forward from the initial state set by the tester 370. During the scan test 374, logical states of the DUT and sensor measurements from the sensor blocks are captured. At 375A and 375B, the corresponding scan test data and sensor data are captured into the corresponding scan chains. This may occur during the capture period of FIG. 2B. At 376A and 376B, the respective scan test data and sensor data are shifted out. The scan test data is shifted out via the logic scan chains 311, and the sensor data is shifted out via the sensor scan chains 351. This may occur during the shift period of FIG. 2. At 377A, the data compressor 313 within the DUT may compress the data, especially the scan test data, so that less bandwidth is required to transmit this data from the DUT off-chip and back to the tester. Data compression may not be applied to the sensor data, in which case the sensor scan chains bypass the data compressor 313.

The scan test data and sensor data may be captured by their respective scan chains and shifted out together. For example, referring to FIG. 2B, sensor data is captured by the streaming registers (which form the sensor scan chain) during the capture period 256. The capture period 256 may be determined by the capture period for the logic scan chains. That is, whenever scan is disabled for the logic scan chains to facilitate capture of scan test data by the logic scan chains, the capture of sensor data will also occur for the sensor scan chains. Similarly, in FIG. 2C, sensor data is shifted out from the sensor scan chains during shift period 257. This shift period 257 may be the same time period used to shift in and shift out data from the logic scan chains. In alternate embodiments, the logic scan chains and sensor scan chains may be operated separately. In some cases, sensor data may be captured and shifted out independent of the scan test data.

At 378, the tester 370 receives both the scan test data and the corresponding sensor data. Referring to FIG. 3A, the DUT 300 may include both logic scan chains 311 and sensor scan chains 351 and the tester 370 may receive data from all of these scan chains at 378. In this way, the tester 370 receives both the scan test data and the corresponding sensor data at the same time. The data from different scan chains may be multiplexed in order to reduce the number of pins on the DUT 300. At 379, the tester 370 or other components may then take appropriate actions based on the sensor data. Many different actions are possible using the sensor data that corresponds to the scan test data.

For example, the scan test data may include test failures. The sensor data corresponding to those test failures may be analyzed. In some cases, the sensor data may indicate that the operating conditions were outside a normal operating range for the DUT and the test failures may be a result of this out-of-range operation. If so, the scan tests may be modified so that the operating conditions stay within the operating range for the DUT during the scan tests. Perhaps the test stimuli included too much toggling of states, which resulted in more activity than normal, and this resulted in operating conditions outside the normal operating range. If so, the test stimuli may be modified to reduce the amount of toggling or to provide more time between toggling of states.

In another variant, the logic circuits may pass the scan tests, but analysis may identify anomalies in the sensor data compared to other devices. This may indicate that the DUT is at greater risk of failure in the future. In that case, the DUT may be rejected, even though the scan test data did not contain any test failures.

Other applications will be apparent. In another aspect, the user may review test results from the test scan data. The corresponding sensor data and/or operating conditions may be displayed or otherwise made available to the user, so that the user may correlate the scan test data and sensor data.

Figure 4:
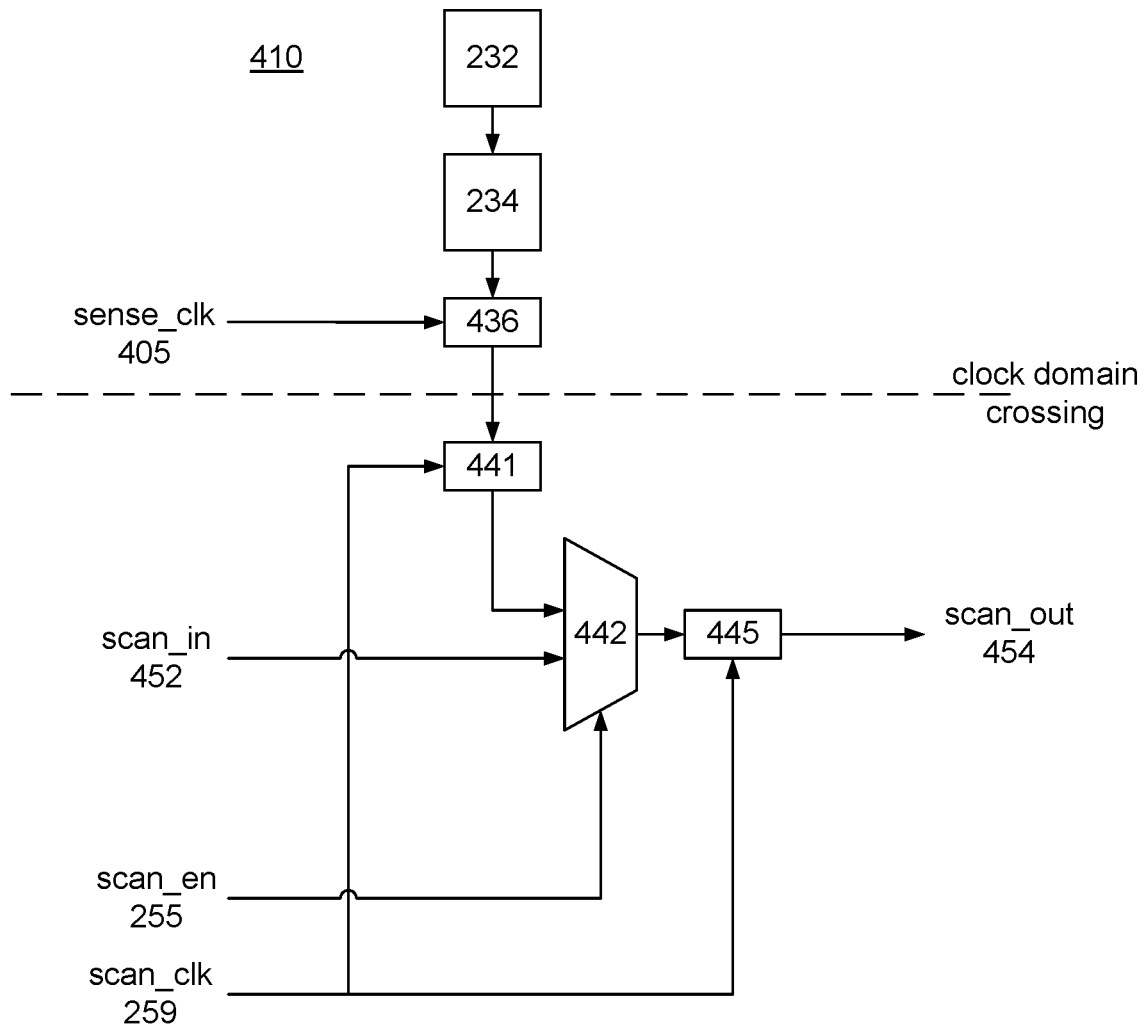
FIGS. 4 and 5 are block diagrams of sensor blocks interconnected to form a scan chain, in accordance with additional embodiments of the present disclosure.
Figure 5:
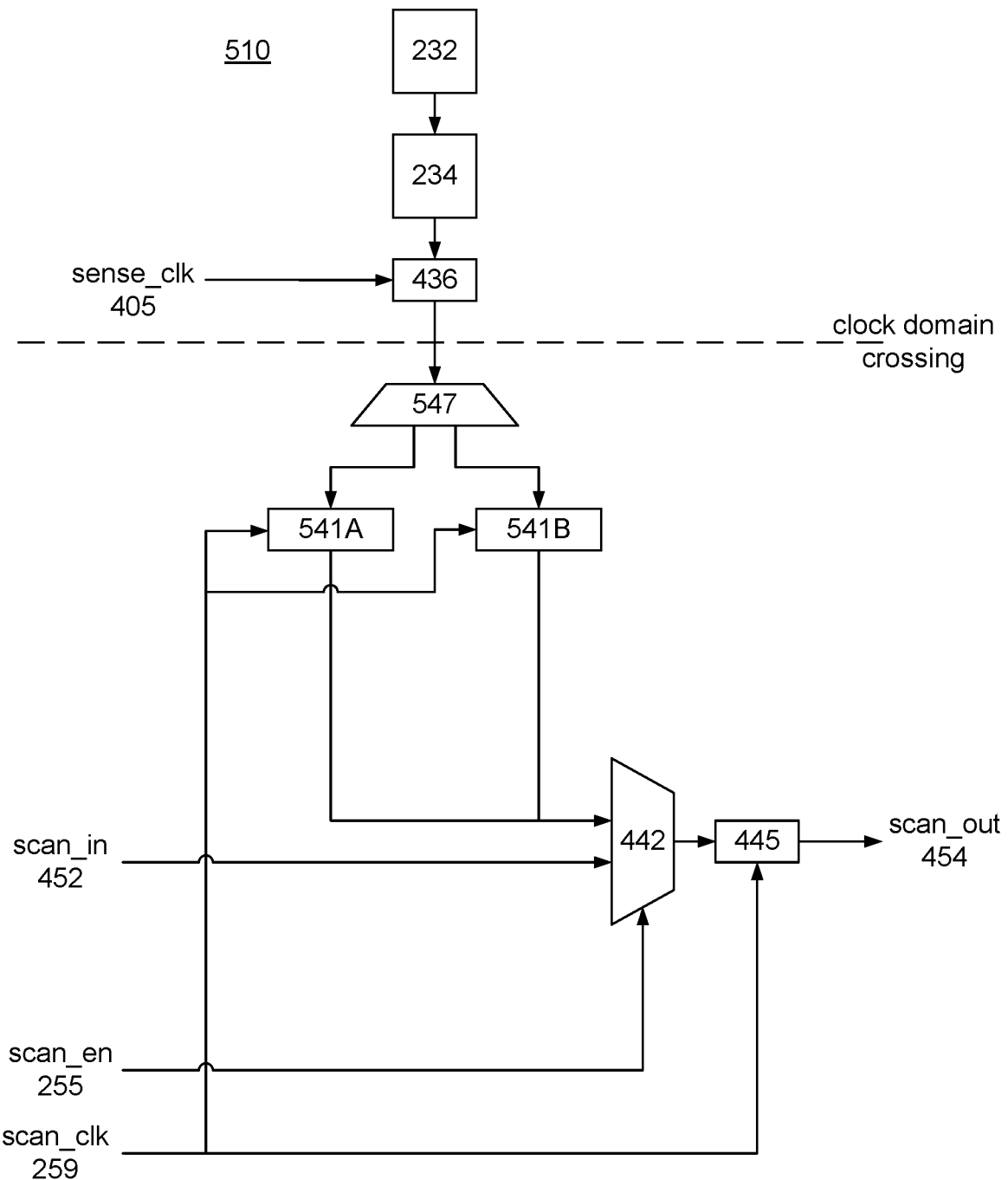

FIGS. 4 and 5 are additional block diagrams of sensor blocks interconnected to form a scan chain, in accordance with additional embodiments of the present disclosure. In the sensor block 410 of FIG. 4, the sensor pipeline 232-234 is clocked by a clock signal 405 that is different than the scan clock 259. As a result, there is a clock domain crossing between the sensor pipeline and the sensor scan chain. In FIG. 4, sensor data is clocked by the sense clock (sense_clk) 405 into register 436. Data is clocked from this register 436 into a holding register 441 according to the scan clock 259. Register 441 is synchronized to the rest of the scan chain, so it may be clocked to streaming register 445. Note that in FIG. 4, scan_in 452 and scan_out 454 are local input and output to register 445, rather than pins on the chip.

If the sensor pipeline runs at a lower data rate than the scan chain, then sensor samples may be shifted out through the scan chain without loss of samples. If the sensor pipeline runs faster, then the sensor samples may be downsampled, for example capturing every Nth sensor sample or capturing some representative value (average, minimum, maximum) of every N sensor samples.

Alternatively, if the sensor pipeline runs faster than the scan chain, sensor samples may be captured in an interleaved fashion, as shown in FIG. 5. Comparing FIGS. 4 and 5, the register 441 in FIG. 4 is duplicated as two registers 541A and 541B in the sensor block 510 of FIG. 5. With respect to the sensor pipeline, the two registers 541A and 541B receive sensor data from register 436 at different time periods, as controlled by demultiplexer 547. For example, if demultiplexer 547 is controlled by scan_en 255, then register 541A may receive sensor data from the register 436 during the capture period and register 541B may receive sensor data from the register 436 during the shift period.

This interleaving of registers 541A, 541B increases the amount of data that may be captured from the sensor pipeline 232-234. With respect to the scan chain, sensor data from the registers 541A, 541B is concatenated and loaded to register 445 during the capture period. This sensor data is then shifted out of the scan chain during the shift period.

Figure 6:
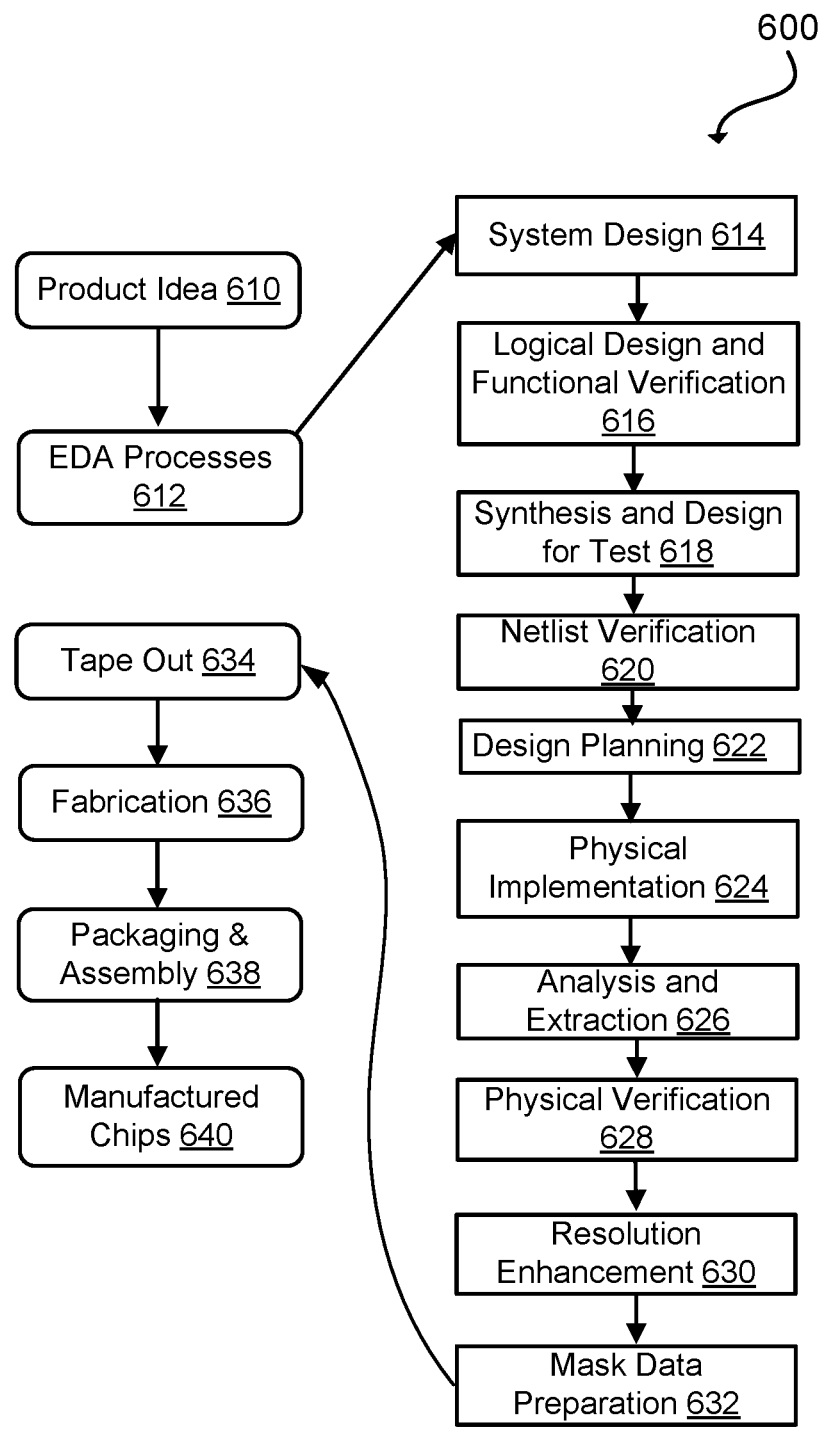
FIG. 6 is a flow diagram of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
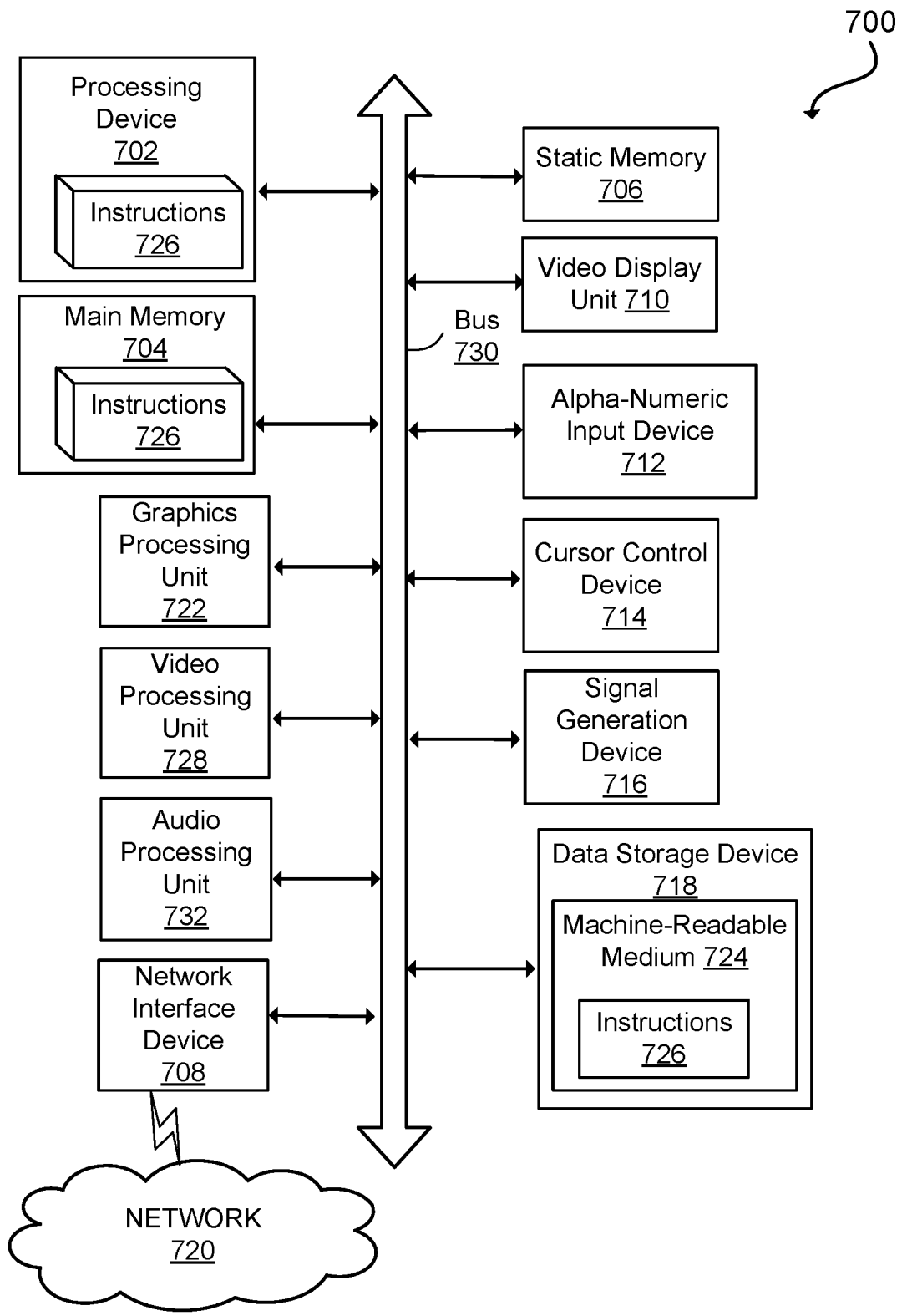
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
running scan tests on an integrated circuit containing logic circuits; wherein the logic circuits are interconnected to form one or more logic scan chains, and running the scan tests comprises shifting out scan test data from the logic circuits through the logic scan chains; and
shifting out sensor data from sensor blocks on the integrated circuit, the sensor blocks capturing measurements of operating conditions for the logic circuits during the scan tests and producing the sensor data from the captured measurements; wherein the sensor blocks are interconnected to form one or more sensor scan chains, and the sensor data is shifted out through the sensor scan chains concurrently with the shifting out of the scan test data through the logic scan chains;
wherein the scan tests are controlled according to a scan enable signal that defines a shift period and a capture period, the method further comprising:
during the capture period, capturing the scan test data by the logic scan chains and capturing the sensor data by the sensor scan chains; and
during the shift period, shifting out the scan test data through the logic scan chains and shifting out the sensor data through the sensor scan chains.

2. The method of claim 1 wherein the sensor data captured by the sensor scan chains includes sensor data based on measurements captured by the sensor blocks during both the capture period and the shift period.

3. The method of claim 1 further comprising:
processing samples of the captured measurements of the operating conditions to produce samples of the sensor data, wherein a number of samples of the sensor data is less than a number of samples of the captured measurements of the operating conditions.

4. The method of claim 3 wherein processing the samples of the captured measurements comprises calculating sensor data that characterizes a distribution of the samples of the captured measurements.

5. The method of claim 1 wherein the sensor blocks produce the sensor data according to a first clock domain and the sensor data is shifted out through the sensor scan chains according to a different second clock domain, the method further comprising synchronizing the production of sensor data according to the first clock domain and the capture of sensor data by the sensor scan chains according to the second clock domain.

6. A device comprising:
logic circuits that implement logic functions; and
sensor blocks that measure operating conditions for the logic circuits, wherein the sensor blocks are interconnected to form one or more sensor scan chains for shifting out sensor data based on the measurements of the operating conditions; and
wherein the logic circuits and the sensor blocks are integrated onto a semiconductor died and at least some of the sensor blocks further comprise a sensor clock that clocks the measurement of operating conditions, a different scan clock that clocks the sensor scan chains, and a clock domain crossing between the sensor clock and the scan clock.

7. The device of claim 6 wherein the measured operating conditions comprise at least one of a process condition, a voltage condition and a temperature condition.

8. The device of claim 6 wherein the sensor blocks further comprise streaming registers, wherein the sensor data is stored in the streaming registers and the streaming registers are interconnected to form the one or more sensor scan chains.

9. The device of claim 8 wherein at least some of the sensor blocks further comprise processing circuits that process the measurements of the operating conditions to generate the sensor data.

10. The device of claim 6 further comprising:
a sensor controller that configures the sensor blocks, wherein the sensor controller is also integrated onto the semiconductor die.

11. The device of claim 6 wherein the logic circuits are also interconnected to form one or more logic scan chains for shifting out scan test data from the logic circuits, and the scan test data from the logic circuits and the sensor data from the sensor blocks are shifted out concurrently.

12. The device of claim 1 further comprising:
a compressor coupled to receive scan test data from multiple logic scan chains, the compressor compressing the scan test data from the multiple logic scan chains, wherein the sensor data from the sensor scan chains bypasses the compressor.

13. A non-transitory computer readable medium comprising stored instructions, which when executed by an automated testing system, cause the automated testing system to:
run scan tests on devices under test (DUTs), each DUT comprising an integrated circuit that contains (a) logic circuits that implement logic functions, and (b) sensor blocks that capture measurements of operating conditions for the logic circuits;
wherein the scan tests comprise:
applying scan test stimuli to the DUT;
receiving resulting scan test data from the logic circuits and corresponding sensor data from the sensor blocks;
wherein the scan tests are controlled according to a scan enable signal that defines a shift period and a capture period; during the capture period, the scan test data is captured by logic scan chains and the sensor data is captured by sensor scan chains; and, during the shift period, the scan test data is shifted out through the logic scan chains and the sensor data is shifted out through the sensor scan chains; and
improve testing of the DUTs based on the sensor data corresponding to the scan test data.

14. The non-transitory computer readable medium of claim 13 further comprising:
analyzing the scan test data for test failures, wherein improving the testing of the DUTs is based on the sensor data corresponding to the test failures.

15. The non-transitory computer readable medium of claim 13 wherein improving the testing of the DUTs comprises:
analyzing the sensor data for operating conditions that are outside an operating range for the DUT; and
modifying the scan tests so that the operating conditions stay within the operating range for the DUT during the scan tests.

16. The non-transitory computer readable medium of claim 13 wherein improving the testing of the DUTs comprises:
   analyzing the sensor data for anomalies in the sensor data that represent a greater risk of future DUT failure; and
   rejecting DUTs based on the anomalies, even if the scan test data for the DUT did not contain any test failures.

17. The non-transitory computer readable medium of claim 13 wherein the instructions further cause the processor to:
   display to a user both test results based on the scan test data and the corresponding operating conditions based on the sensor data.

18. The non-transitory computer readable medium of claim 17 wherein the displayed operating conditions include at least one of a processing condition, a voltage condition and a temperature condition.

* * * * *